United States Patent
Hoang et al.

(10) Patent No.: US 9,627,565 B2
(45) Date of Patent: Apr. 18, 2017

(54) INTEGRAL CORNER BYPASS DIODE INTERCONNECTING CONFIGURATION FOR MULTIPLE SOLAR CELLS

(71) Applicant: Space Systems/Loral, LLC, Palo Alto, CA (US)

(72) Inventors: Bao Hoang, San Francisco, CA (US); Samuel Geto Beyene, Hayward, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 429 days.

(21) Appl. No.: 14/092,775

(22) Filed: Nov. 27, 2013

(65) Prior Publication Data

US 2015/0144173 A1 May 28, 2015

(51) Int. Cl.

| | |
|---|---|
| *H01L 31/00* | (2006.01) |
| *H01L 31/042* | (2014.01) |
| *H02N 6/00* | (2006.01) |
| *H01L 31/0443* | (2014.01) |
| *H01L 31/05* | (2014.01) |
| *H01L 31/044* | (2014.01) |

(52) U.S. Cl.
CPC ........ *H01L 31/0443* (2014.12); *H01L 31/042* (2013.01); *H01L 31/044* (2014.12); *H01L 31/05* (2013.01); *H01L 31/0504* (2013.01); *H01L 31/0508* (2013.01); *Y02E 10/50* (2013.01)

(58) Field of Classification Search
CPC ... H01L 31/044; H01L 31/0443; H01L 31/05; H01L 31/0504; H01L 31/0508; Y02E 10/50

USPC .................. 136/244, 251, 252, 256
See application file for complete search history.

(56) References Cited

U.S. PATENT DOCUMENTS

| | | | |
|---|---|---|---|
| 3,369,939 A | * | 2/1968 Myer | ........... H01L 31/00 136/244 |
| 3,696,286 A | | 10/1972 Ule | |
| 4,401,839 A | | 8/1983 Pyle | |

(Continued)

FOREIGN PATENT DOCUMENTS

| | | |
|---|---|---|
| GB | 2224391 | 5/1990 |
| JP | 61289675 | 12/1986 |

OTHER PUBLICATIONS

PCT International Search Report dated Sep. 28, 2012 issued in PCT/US2012/046924.

(Continued)

*Primary Examiner* — Lindsey Bernier
(74) *Attorney, Agent, or Firm* — Weaver Austin Villeneuve & Sampson LLP

(57) ABSTRACT

A photovoltaic solar cell assembly includes a bypass diode, a first and a second planar solar cell. Each of the first and the second solar cell includes a front facing side and a rear facing side, each rear facing side including a respective conductive surface, each front facing side including a respective current collector bar, and corresponding grid of metallic lines conductively coupled with the current collector bar. A first terminal of the bypass diode is electrically coupled with the conductive surface of the first solar cell. A second terminal of the bypass diode is electrically coupled with the current collector bar of the second solar cell. Electrical coupling of the bypass diode with the first solar cell and the second solar cell excludes any external wiring or busbar.

20 Claims, 6 Drawing Sheets

Perspective View

Schematic View

(56) References Cited

U.S. PATENT DOCUMENTS

| | | |
|---|---|---|
| 4,413,157 A | 11/1983 | Ames |
| 4,542,578 A | 9/1985 | Yamano et al. |
| 4,609,770 A | 9/1986 | Nishiura et al. |
| 4,652,693 A | 3/1987 | Bar-On |
| 4,705,911 A | 11/1987 | Nakano et al. |
| 4,754,544 A | 7/1988 | Hanak |
| 5,006,179 A | 4/1991 | Gaddy |
| 5,236,516 A | 8/1993 | Noguchi et al. |
| 5,389,159 A | 2/1995 | Kataoka et al. |
| 5,542,988 A | 8/1996 | Bogus |
| 5,637,155 A | 6/1997 | Inoue |
| 5,637,156 A | 6/1997 | Kubota et al. |
| 5,688,337 A | 11/1997 | Mosher |
| 5,897,715 A | 4/1999 | Ward et al. |
| 6,034,322 A | 3/2000 | Pollard |
| 6,248,950 B1 | 6/2001 | Hoeber et al. |
| 6,294,725 B1 | 9/2001 | Hirschberg et al. |
| 7,115,811 B2 | 10/2006 | Ho et al. |
| 8,440,492 B2 | 5/2013 | Chan et al. |
| 2005/0133086 A1* | 6/2005 | Itoyama ............ H01L 31/02008 136/256 |
| 2006/0118165 A1 | 6/2006 | Van Roosmalen et al. |
| 2008/0092942 A1* | 4/2008 | Kinsey .............. H01L 31/02243 136/252 |
| 2009/0038671 A1* | 2/2009 | Yamaguchi ......... H01L 31/0508 136/244 |
| 2009/0126788 A1 | 5/2009 | Hishida et al. |
| 2013/0019919 A1 | 1/2013 | Hoang et al. |

OTHER PUBLICATIONS

U.S. Appl. No. 13/189,354, filed Jul. 22, 2011.
U.S. Office Action dated Jun. 14, 2013 issued in U.S. Appl. No. 13/189,354.
U.S. Office Action dated Nov. 8, 2013 issued in U.S. Appl. No. 13/189,354.
La Roche, G. J., et al. (Sep. 1995) "Long Term Thermal Cycling Tests on Gold Interconnected Solar Cells", European Space Power, vol. 2: Photovoltaic Generators, Energy Storage, Proceedings of the 4th European Space Power Conference, Poitiers, France, Sep. 4-8, 1995, Edited by T.-D. Guyenne. Paris: European Space Agency (ESA), ESA-SP, vol. 369, 1995, pp. 495-500.
Sankaran, M., et al. (Sep. 1995) "On the Development of Solar Arrays for INSAT 2A and 2B", Proceedings of the European Space Power Conference, vol. 2, pp. 649-652.
Diamond—Definition and More from the Free Merriam-Webster Dictionary, www.merriam-webster.com/dictionary/diamond, accessed on Nov. 4, 2013.

* cited by examiner

INTEGRAL CORNER BYPASS DIODE INTERCONNECTING CONFIGURATION FOR MULTIPLE SOLAR CELLS

TECHNICAL FIELD

This invention relates generally to photovoltaic solar array panels, and, more particularly, to an improved arrangement for integrating a bypass diode so as to protect multiple solar cells.

BACKGROUND OF THE INVENTION

The assignee of the present invention designs and manufactures spacecraft for communications and broadcast services. Electrical power for such spacecraft is conventionally generated by photovoltaic solar arrays, each solar array typically having several panels, each panel having many hundreds of solar cells.

A better appreciation of the presently disclosed techniques may be obtained by referring first to FIG. 1 which illustrates some typical features of solar cells and solar cell interconnects of the prior art. FIG. 1 depicts a perspective and exploded perspective view of two adjacent solar cells configured for use in a photovoltaic solar array. The solar cells 22(1) and 22(2) may each include a semiconductor substrate of silicon, gallium arsenide, germanium or other similar semiconductor materials.

A light receiving surface (referred to herein as the front facing side) of each solar cell includes a grid, typically composed of parallel spaced longitudinally extending fine metallic lines 130 that are conductively coupled to at least one current collector bar 140.

To facilitate building a solar array including a large number of individual cells, each cell may be configured as a cover integrated cell (CIC). As illustrated, for example, cell 22 includes a thin glass cover 30 adhered to the front facing side of cell 22 by an adhesive layer 31, the CIC 20 also including one or more electrically conductive interconnects 26 that may be conductively coupled to contact pads 24 that are electrically coupled with current collector bar 140.

Referring now to View B-B of FIG. 1, where rear facing side 64 of each cell includes a respective conductive surface disposed opposite to front facing side 62, it may be observed that interconnect 26 may provide an electrically conductive coupling between current collector bar 140 of a first cell 22(1) and the conductive surface of the rear facing side of an adjacent cell 22(2). It will be appreciated that a contact pad 24 may be disposed between a first end of interconnect 26 and current collector bar 140. Similarly, a contact pad 24 may be disposed between a second end of interconnect 26 and the conductive surface of the rear facing side of an adjacent cell 22(2).

Since, in typical space applications the satellites are subjected to eclipse cycles on orbit, the temperature excursion of the solar array may be in a range between −175° C. and +60° C. This temperature variation causes relative motion between cells due to the thermal expansion and contraction of the solar cells. As a result, interconnects 26 may are required to be flexible to accommodate this relative motion as indicated by the loops in the figure. It will be appreciated that a variety of arrangements of multiple solar cells (either in series or parallel connection) may be provided by appropriately coupling interconnects 26 and cells 22. The interconnect 26, or similar device, may also be used to connect other electrical components, such as a bypass diode to the cell 22.

Because the above described CIC interconnects have been produced and flown successfully in large numbers, it is highly desirable to use such interconnects for cell-to-cell electrical connection in preference to external wiring or bus bars.

Referring now to FIG. 2, it is illustrated how a bypass diode 84 may be conventionally connected in parallel with the solar cell 22 to provide current limiting protection. Bypass diode 84 may be configured to protect the solar cell 22 from damage if a solar cell is reverse biased due to a mismatch in short-circuit current capability or light shadowing between several series connected cells.

As disclosed in U.S. Pat. No. 6,034,322, assigned to the assignee of the present invention, a generally rectilinear solar cell may include one or more beveled corner edges 66, proximate to which bypass diode 84 may be advantageously disposed. More particularly, bypass diode 84 may be disposed in the phantom-lined triangular wedge-shaped volume depicted in FIG. 2. In the illustrated configuration, a first terminal of bypass diode 84 is electrically coupled to current collector bar 140 by way of upper interconnect member 92. A second terminal of bypass diode 84 is electrically coupled to a conductive surface of a rear facing side of cell 22 by way of lower interconnect member 94.

Interconnect members 92 and 94, like interconnects 26, include provisions for in plane stress relief 90 to assure integrity of assembly during repeated expansion and contraction under certain environmental conditions. Each of the upper interconnect member 92 and lower interconnect member 94 may include an interconnect made of silver or other similar metal with a stress relief feature formed between the diode and the cell, for example.

Because the above described diode interconnect members have been produced and flown successfully in large numbers, it is highly desirable to use such interconnects for diode-to-cell electrical connection as opposed to external wiring or bus bars which are more costly, less reliable, and require an appreciable amount of solar panel area that would otherwise be available for placement of solar cells.

In the configuration illustrated in FIG. 2, the bypass diode 84 is electrically connected in parallel to exactly one solar cell 22. Depending upon the reverse breakdown voltage of the cell, two or more cells connected in series may be sufficiently protected by a single bypass diode. For example, as illustrated in FIG. 3, a single bypass diode 84 may be connected in parallel to a series-connected pair of cells 22. Such a configuration, advantageously, may reduce the number of bypass diodes by a factor of two, but disadvantageously requires external wiring or bus bar 301.

As a result, improved techniques for providing bypass diode paralleled across at least two solar cells are desirable

SUMMARY

The present disclosure contemplates an improved configuration of series connected photovoltaic solar cells, wherein a single bypass diode is connected in parallel across two series-connected solar cells to form a photovoltaic solar cell assembly, using flight qualified interconnects while avoiding use of external wiring or bus bar.

In an implementation, the photovoltaic solar cell assembly includes a bypass diode, a first planar solar cell, and a second planar solar cell. Each of the first solar cell and the second solar cell includes a front facing side and a rear facing side opposite the front facing side, each rear facing side including a respective conductive surface. Each front facing side includes a respective current collector bar, and a corresponding grid of metallic lines conductively coupled with the current collector bar. A first terminal of the bypass diode is electrically coupled with the conductive surface of the first solar cell. A second terminal of the bypass diode is electrically coupled with the current collector bar of the second solar cell. An electrical coupling of the bypass diode with the first solar cell and the second solar cell excludes any external wiring or busbar.

In another implementation, the first terminal may be connected by way of a first electrical coupling to the conductive surface of the first solar cell and the second terminal is connected by way of a second electrical coupling with the current collector bar of the second solar cell.

In a further implementation, the second electrical coupling may include a first cell interconnect.

In another implementation, each solar cell may include a first edge, a second edge, a third edge, and a fourth edge, the current collector bar comprising at least two conductively coupled collector bar segments. A first collector bar segment may be substantially parallel to and proximate to the first edge, and a second collector bar segment may be substantially parallel to and proximate to the second edge, the second edge being orthogonal with respect to the first edge. No collector bar segment is parallel to and proximate to at least one of the third edge and the fourth edge.

In a yet further implementation, the second terminal of the bypass diode is adjacent to a proximal end of the second collector bar segment of the second solar cell. The photovoltaic solar cell assembly may further include at least a second cell interconnect, whereby the second terminal of the bypass diode is electrically coupled with the second collector bar segment of the second solar cell.

In an implementation, the corresponding grid of metallic lines may include a plurality of parallel metallic lines, said lines being substantially straight.

In another implementation, each of the plurality of parallel metallic lines is disposed substantially orthogonal to the first edge and substantially parallel to the second edge.

In a further implementation, each of the plurality of parallel metallic lines is disposed at an acute angle to the first edge and to the second edge.

In an implementation, a solar panel may include a plurality of photovoltaic solar cell assemblies, the solar panel further including a plurality of strings, each said string comprising a series connected subset of the plurality of photovoltaic solar cell assembly, Each solar cell assembly includes a bypass diode, a first planar solar cell, and a second planar solar cell, each of the first solar cell and the second solar cell including a front facing side and a rear facing side opposite the front facing side. Each rear facing side includes a respective conductive surface, each front facing side includes a respective current collector bar, and a corresponding grid of metallic lines conductively coupled with the current collector bar. A first terminal of the bypass diode is electrically coupled with the conductive surface of the first solar cell and a second terminal of the bypass diode is electrically coupled with the current collector bar of the second solar cell. Electrical coupling of the bypass diode with the first and second solar cell excludes any external wiring or external busbar.

BRIEF DESCRIPTION OF THE DRAWINGS

Features of the invention are more fully disclosed in the following detailed description of the preferred embodiments, reference being had to the accompanying drawings, in which.

Figure 1:
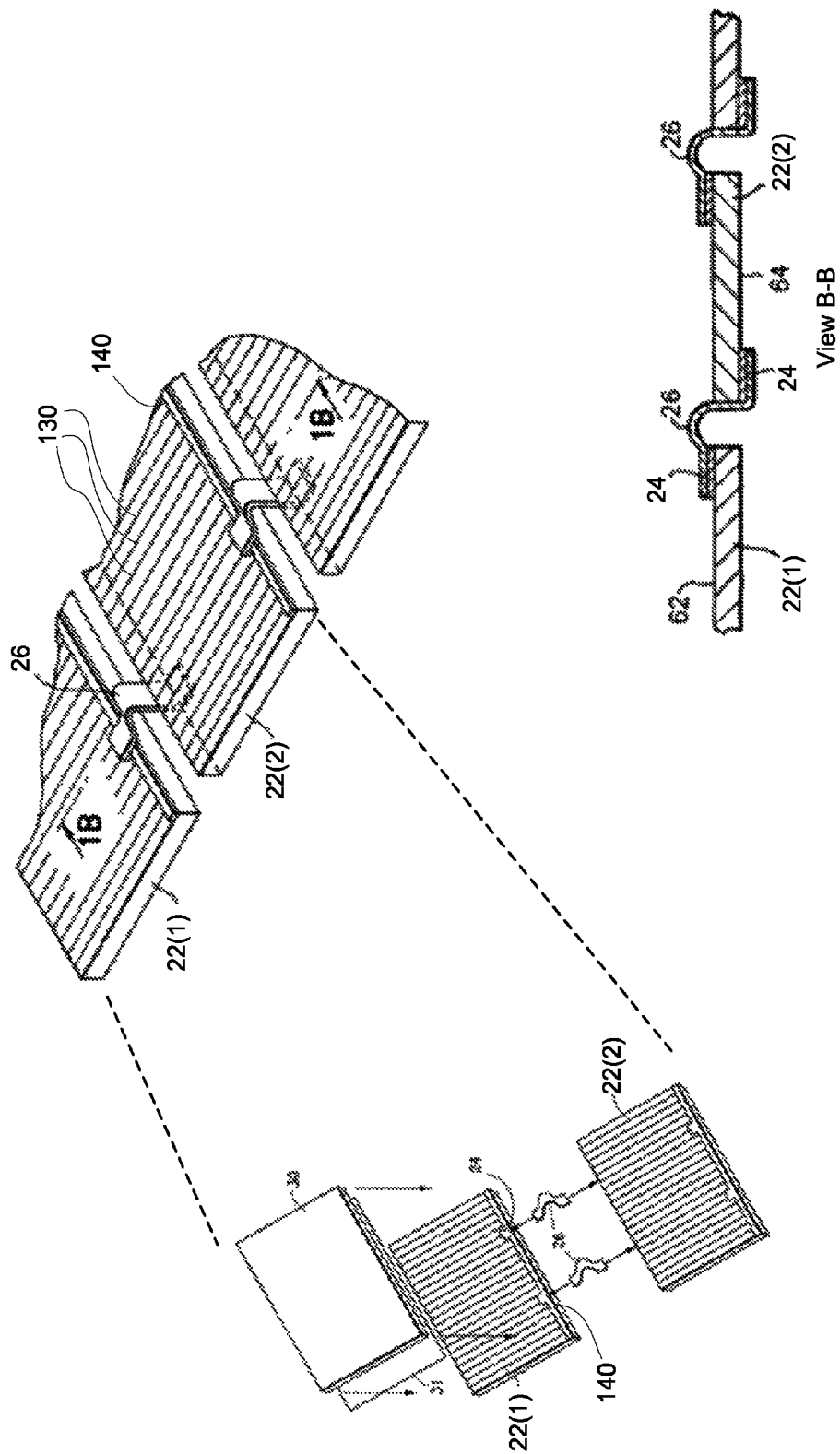
FIG. 1 illustrates examples of solar cells of the prior art.

Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the subject invention as defined by the appended claims.

DETAILED DESCRIPTION

Specific examples of embodiments will now be described with reference to the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected" or "coupled" to another element, it can be directly connected or coupled to the other element, or intervening elements may be present. It will be understood that although the terms "first" and "second" are used herein to describe various elements, these elements should not be limited by these terms. These terms are used only to distinguish one element from another element. As used herein, the term "and/or" includes any and all combinations of one or more of the associated listed items. The symbol "/" is also used as a shorthand notation for "and/or".

Figure 4:
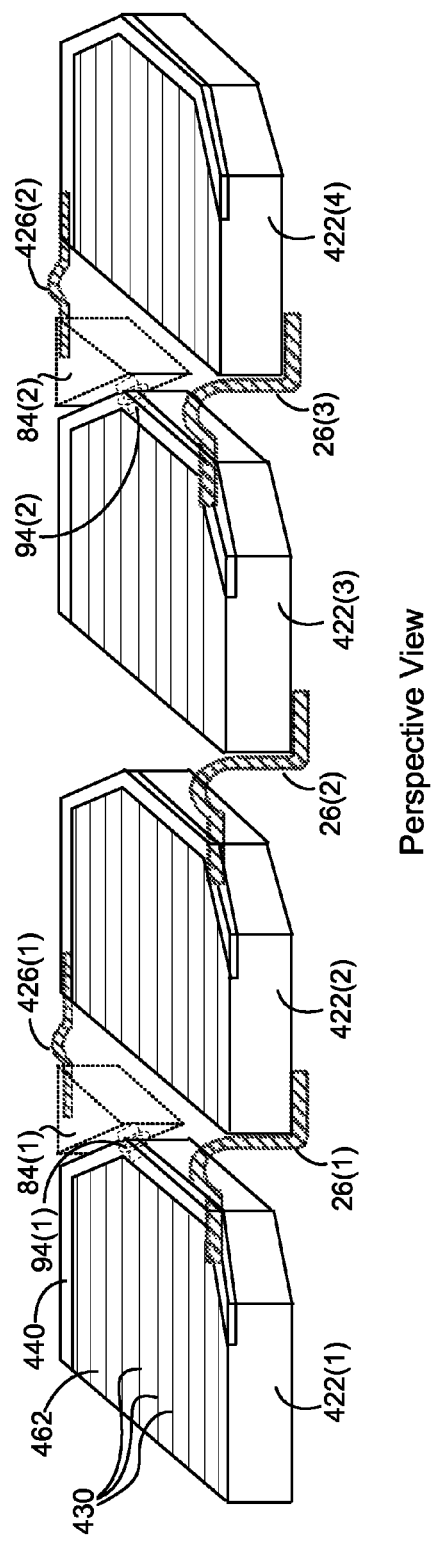
FIG. 4 illustrates a solar cell with bypass diode, according to an embodiment.
Figure 4:
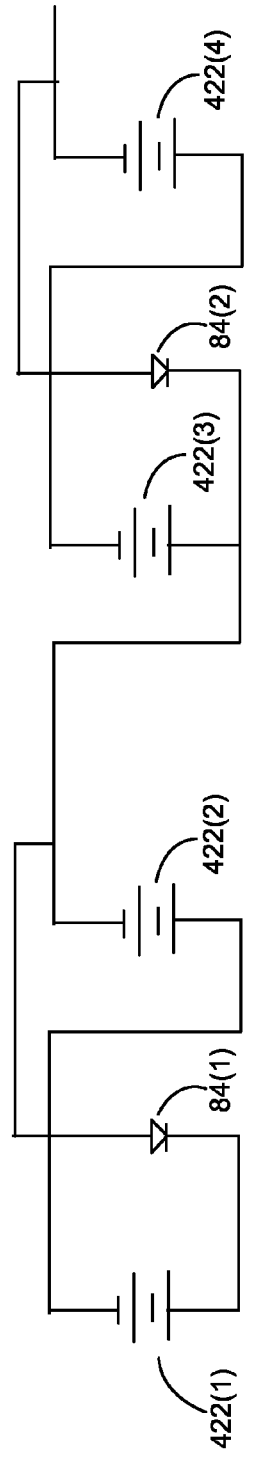

According to an embodiment of the presently disclosed techniques, referring now to FIG. 4, photovoltaic solar cell assembly 400 includes a number of planar solar cells 422. In the illustrated embodiment, four planar solar cells 422 are depicted, but it will be understood that as few as two planar solar cells may constitute the photovoltaic solar cell assembly or "string". In some implementations contemplated by the present inventors, a string may be composed of a larger number of planar solar cells. For example, in some implementations, a string may include forty eight planar solar cells.

Figure 2:
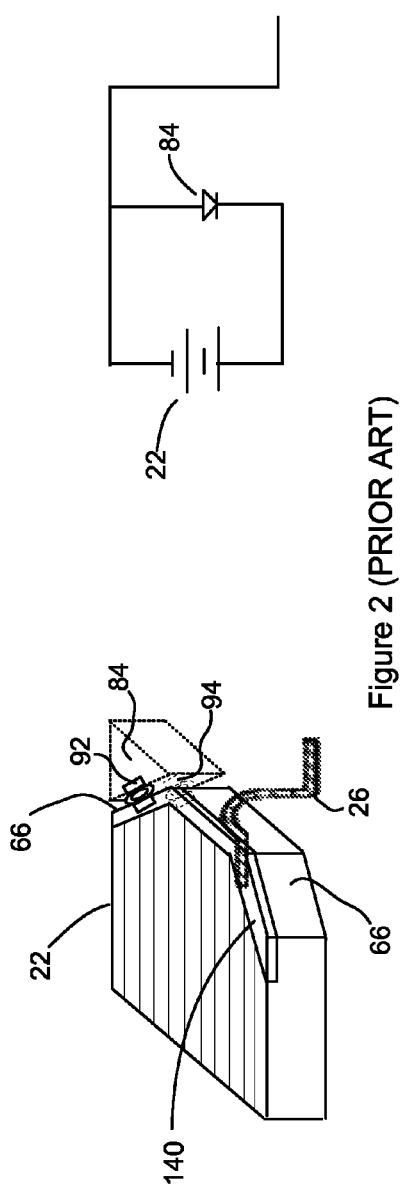
FIG. 2 illustrates examples of solar cells and solar cell bypass diodes of the prior art.
Figure 3:
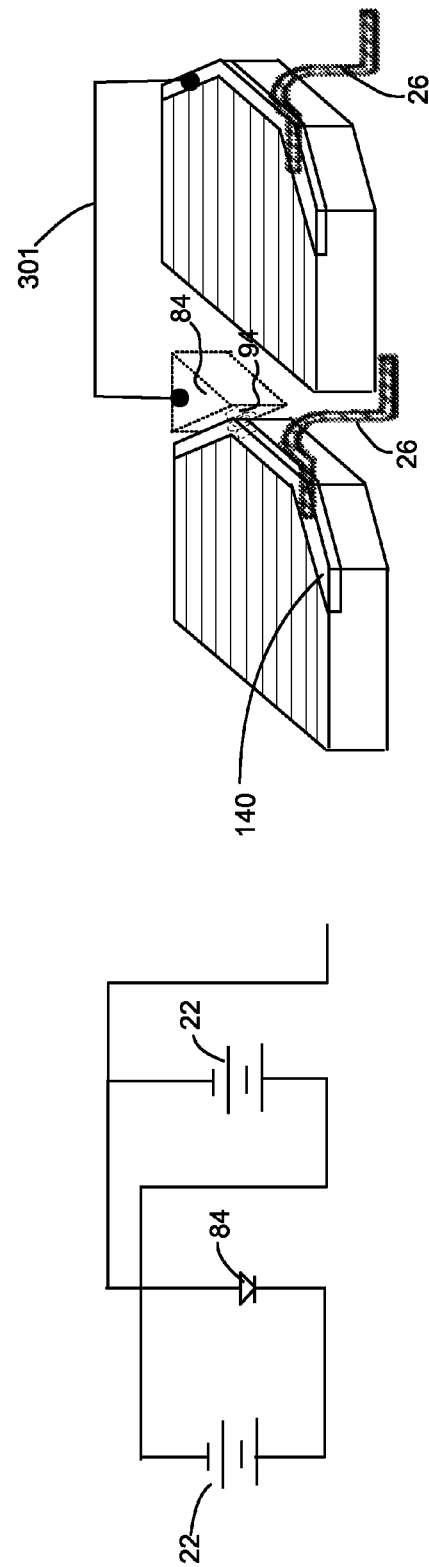
FIG. 3 illustrates examples of solar cells and solar cell bypass diodes of the prior art.

Solar cell assembly 400 may include a bypass diode disposed between, and electrically coupled to, a pair of planar solar cells. In the illustrated implementation, for example, a first bypass diode 84(1) is disposed between solar cell 422(1) and solar cell 422(2); a second bypass diode 84(2) is disposed between solar cell 422(3) and solar cell 422(4). Advantageously, each bypass diode may be located proximate to a beveled corner edge of a respective solar cell as described above in connection FIG. 2, for example. More particularly, each bypass diode 84 may be disposed in a respective triangular wedge-shaped volume depicted by phantom lines in FIG. 4.

Referring still to FIG. 4, the perspective view illustrates a front facing (light receiving) side 462 of each solar cell 422. The front facing side includes current collector bar 440, and a corresponding grid of metallic lines 430 that are conductively coupled with the current collector bar 440. A rear facing side (not illustrated) of each solar cell 422 includes a respective conductive surface.

As illustrated in the schematic view of FIG. 4, each solar cell 422 may be depicted schematically as a battery, of which a negative electrode includes the current collector bar 440, and a positive electrode includes the conductive surface of the rear facing side. In the illustrated implementation, the solar cells 422 are connected in series by way of interconnects 26. More particularly, a first terminal of interconnect 26(1) is electrically coupled with the negative electrode (current collector bar 440) of solar cell 422(1) while a second terminal of interconnect 26(1) is electrically coupled with the positive electrode (conductive surface of the rear facing side) of solar cell 422 (2). Similarly, a first terminal of interconnect 26(2) is electrically coupled with the negative electrode of solar cell 422(2) while a second terminal of interconnect 26(2) is electrically coupled with the positive electrode of solar cell 422 (3). Similarly, a first terminal of interconnect 26(3) is electrically coupled with the negative electrode of solar cell 422(3) while a second terminal of interconnect 26(3) is electrically coupled with the positive electrode of solar cell 422 (4).

Referring still to the schematic view of FIG. 4, each bypass diode 84 is paralleled two adjacent solar cells. In the illustrated implementation, for example, a first terminal of bypass diode 84(1) is electrically coupled with the positive electrode of solar cell 422 (1) while a second terminal of bypass diode 84(1) is electrically coupled with the negative electrode of solar cell 422(2). Similarly, a first terminal of bypass diode 84(2) is electrically coupled with the positive electrode of solar cell 422(3) while a second terminal of bypass diode 84(2) is electrically coupled with the negative terminal of solar cell 422(4).

Advantageously, electrical couplings between each bypass diode 84 and the solar cells to which pass diode 84 is coupled include cell interconnect means as described above in connection with FIG. 2. More particularly, referring again to the perspective view of FIG. 4, the electrical couplings may be provided by interconnect members 94 and interconnects 426 while avoiding use of any external wiring or external busbar. In the illustrated implementation, for example, the first terminal of bypass diode 84(1) is electrically coupled with the conductive surface of the rear facing side of solar cell 422 (1) by way of interconnect member 94(1); the second terminal of bypass diode 84(1) is electrically coupled with the current collector bar 440 of solar cell 422(2) by way of interconnect 426(1). Similarly, the first terminal of bypass diode 84(2) is electrically coupled to the conductive surface of the rear facing side of solar cell 422 (3) by way of interconnect member 94(2) while the second terminal of bypass diode 84(2) is electrically coupled with the current collector bar 440 of solar cell 422(4) by way of interconnect 426(2)

As a result, a single bypass diode may be configured to protect two solar cells, without recourse to external wiring or an external busbar.

Figure 5:
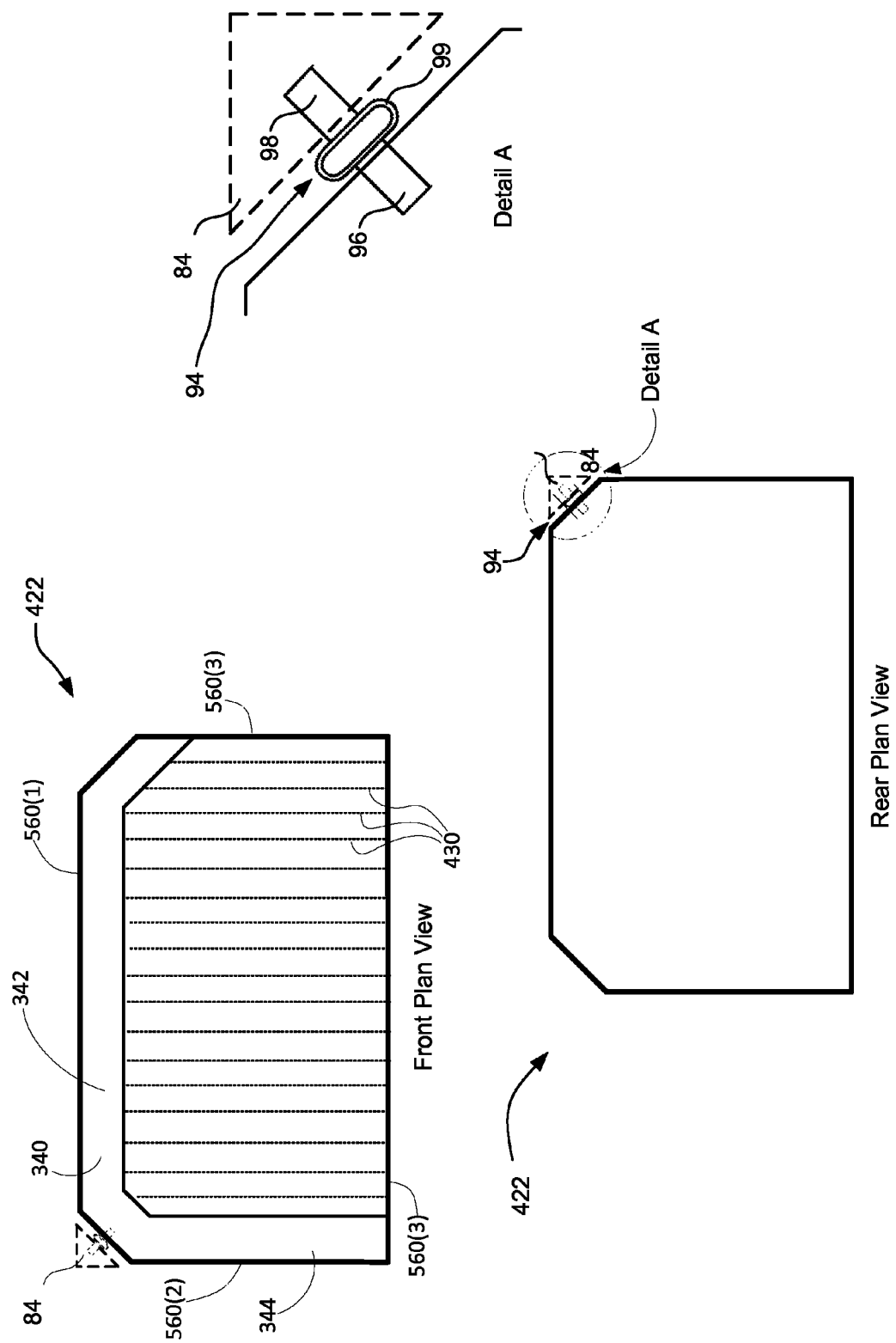
FIG. 5 illustrates a solar cell with an "L" shaped current collector bar.

The above-noted result may be achieved, in some implementations, referring now to FIG. 5, by configuring solar cell 422 with an "L-shaped" collector bar 340 having first collector bar segment 342 and second collector bar segment 344. As may be observed in the Front Plan View of FIG. 5, first collector bar segment 342 may be substantially parallel to and proximate to first edge 560(1) of solar cell 22, and second collector bar segment 344 may be substantially parallel to and proximate to second edge 560(2). Second edge 560(2) may be orthogonal to first edge 560(1). In the illustrated implementation, no collector bar segment is parallel to and proximate to third edge 560(3) and fourth edge 560(4). Advantageously, for ease of cell manufacture, no collector bar segment is parallel to and proximate to at least one of third edge 560(3) and fourth edge 560(4). The grid of metallic lines 430 may be conductively coupled to collector bar 340.

Referring again to FIG. 4, it will be appreciated that, as a result of the above-described collector bar configuration, the second terminal of the bypass diode 84(1) is adjacent to a proximal end of the current collector bar 440 of the solar cell 422(2), and an electrical coupling there between may be readily provided by way of interconnect 426(1).

Referring now to the Rear Plan View of FIG. 5, more particularly to Detail A, an implementation of lower interconnect member 94 is depicted. Lower interconnect member 94 may extend between and be coupled with the conductive surface on the rear facing side 64 of cell 422 and the first terminal of bypass diode 84. In some implementations, metallic pads members (not illustrated) may be disposed between lower interconnect member 94 and one or both of the conductive surface on the rear facing side 64 of cell 422 and the first terminal of bypass diode 84. In the illustrated implementation, interconnect member 94 includes first and second spaced apart mounting flanges 96, 98. The first mounting flange 96 may be suitably joined, as by soldering, for example to the conductive surface on the rear facing side 64 or a metallic pad member disposed thereon. The second mounting flange 98 may be similarly joined to the first terminal of bypass diode 84 or to a metallic pad member conductively coupled therewith. A stress relief member 99 extends between first mounting flange 96 and second mounting flange 98. The stress relief member 99 may be coplanar with, and be fixed at respective opposite ends to the first mounting flange 96 and the second mounting flange 98.

Figure 6:
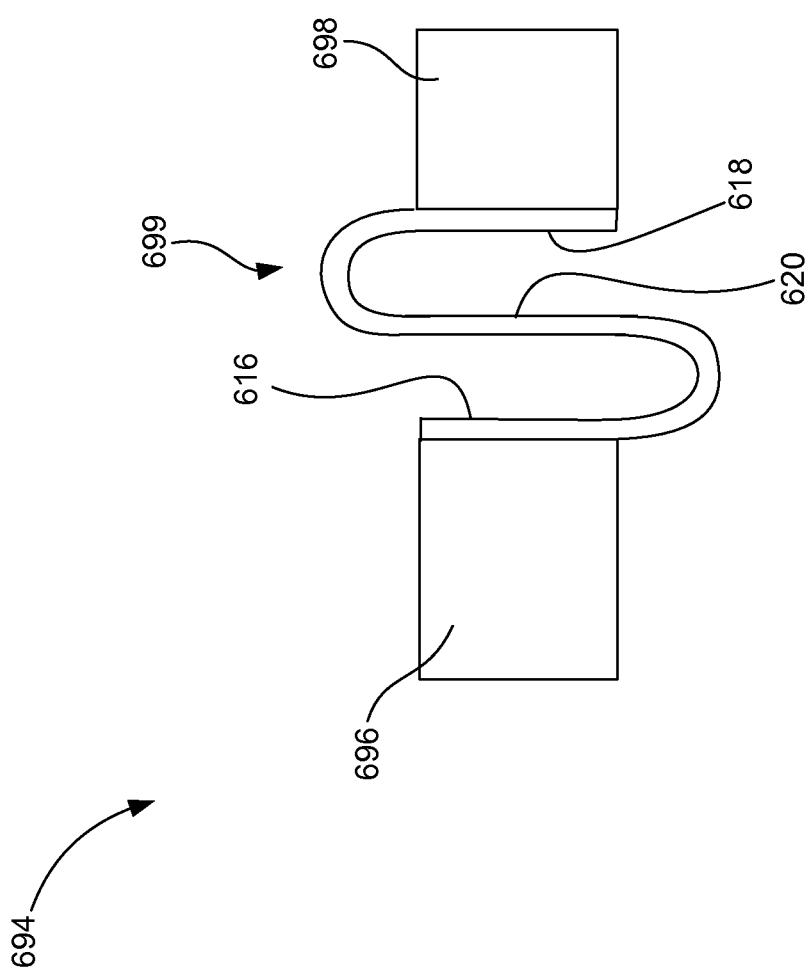
FIG. 6 illustrates an example of an interconnect arrangement for attaching a bypass diode to a solar cell.

Referring now to FIG. 6, in some implementations, stress relief member 699 may include a resilient, electrically conductive S-shaped member having opposed legs 616, 618 and an integral bight member 620. Opposed mounting flanges 696 and 698 may be aligned and joined, respectively, to the opposed legs 616 and 618, the stress relief member thereby accommodating relative in-plane motion between the first and second mounting flanges 696 and 698.

Referring again to FIG. 5, in the illustrated implementation, a generally rectilinear planar solar cell 422 is configured such that each line 430 of the grid of metallic lines is disposed substantially orthogonal to first edge 560(1), and substantially parallel to second edge 560(2). However, other implementations are within the contemplation of the present disclosure.

Figure 7:
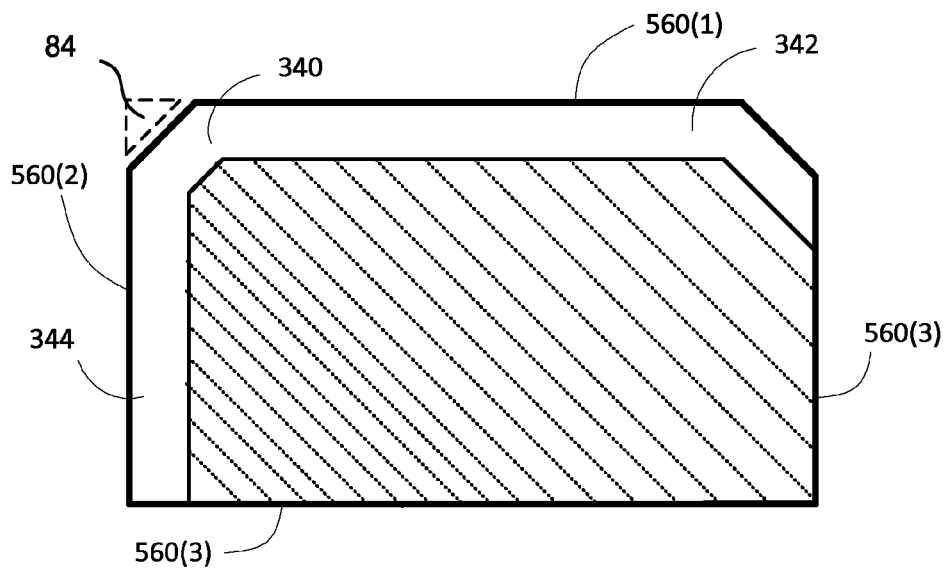
FIG. 7 illustrates a solar cell with bypass diode, according to an embodiment.
Figure 8:
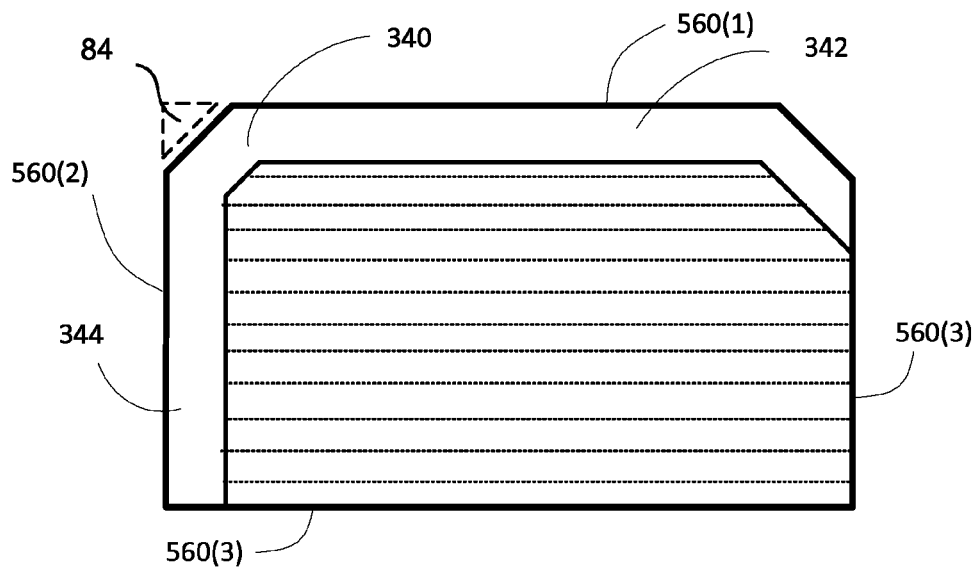
FIG. 8 illustrates a solar cell with bypass diode, according to an embodiment.

For example, referring now to FIG. 7, in some implementations, each of the plurality of parallel metallic lines 130 may be disposed at an acute angle to first edge 560(1) and to second edge 560(2). As a further example, referring to FIG. 8, in some implementations, a square or rectangular solar cell may be configured such that each line 430 of the grid of metallic lines is disposed substantially orthogonal to second edge 560(2), and substantially parallel to first edge 560(1).

Thus, techniques have been disclosed, wherein an improved configuration of a solar cell assembly includes two solar cells commonly protected by a single bypass diode. According to the disclosed techniques, electrical coupling of the bypass diode with each solar cell is accomplished without necessity for using any external wiring or external busbar.

The foregoing merely illustrates principles of the invention. It will thus be appreciated that those skilled in the art will be able to devise numerous systems and methods which, although not explicitly shown or described herein, embody said principles of the invention and are thus within the spirit and scope of the invention as defined by the following claims.

What is claimed is:

1. A photovoltaic solar cell assembly comprising:
    a bypass diode;
    a first planar solar cell; and
    a second planar solar cell, each of the first solar cell and the second solar cell including a front facing side and a rear facing side opposite the front facing side, each rear facing side including a respective conductive surface, each front facing side including a respective current collector bar, and a corresponding grid of metallic lines conductively coupled with the current collector bar; wherein:
    each solar cell includes a first edge, a second edge, a third edge, and a fourth edge, a distance between the second edge and the fourth edge defining a characteristic width of each cell;
    each current collector bar comprises at least two conductively coupled collector bar segments, the at least two conductively coupled collector bar segments including a first collector bar segment that is substantially parallel to and proximate to the first edge, and a second collector bar segment that is substantially parallel to and proximate to the second edge, the second edge being orthogonal with respect to the first edge;
    the bypass diode is disposed between the first planar solar cell and the second planar solar cell, proximate to a beveled corner edge of the first planar solar cell;
    a first terminal of the bypass diode is connected by way of a first electrical coupling to the conductive surface of the first solar cell, a proximal portion of the first electrical coupling being connected with the first terminal, a distal portion of the first electrical coupling underlying the rear facing side of the first solar cell;
    a second terminal of the bypass diode is connected by way of a second electrical coupling to the second collector bar segment of the current collector bar of the second solar cell a proximal portion of the second electrical coupling being connected with the second terminal, a distal portion of the second electrical coupling overlying the front facing side of the second solar cell; and
    each of the first electrical coupling and the second electrical coupling excludes any external wiring or busbar.

2. The photovoltaic solar cell assembly of claim 1, wherein:
    the first electrical coupling and the second electrical coupling include no portions external to the characteristic width.

3. The photovoltaic solar cell assembly of claim 2, wherein the first electrical coupling includes an interconnect member.

4. The photovoltaic solar cell assembly of claim 1, wherein in each solar cell:
    no collector bar segment is parallel to and proximate to at least one of the third edge and the fourth edge.

5. The photovoltaic solar cell assembly of claim 4, wherein the second terminal of the bypass diode is adjacent to a proximal end of the second collector bar segment of the second solar cell, and the second electrical coupling includes a first cell interconnect.

6. The photovoltaic solar cell assembly of claim 4, wherein in each solar cell the corresponding grid of metallic lines comprises a plurality of parallel metallic lines, said lines being substantially straight.

7. The photovoltaic solar cell assembly of claim 6, wherein each of the plurality of parallel metallic lines is disposed substantially orthogonal to the first edge and substantially parallel to the second edge.

8. The photovoltaic solar cell assembly of claim 6, wherein each of the plurality of parallel metallic lines is disposed at an acute angle to the first edge and to the second edge.

9. A solar panel comprising:
    a plurality of photovoltaic solar cell assemblies, the solar panel further comprising a plurality of strings, each said string comprising a series connected subset of the plurality of photovoltaic solar cell assemblies, wherein each solar cell assembly includes:
    a bypass diode;
    a first planar solar cell; and
    a second planar solar cell, each of the first solar cell and the second solar cell including a front facing side and a rear facing side opposite the front facing side, each rear facing side including a respective conductive surface, each front facing side including a respective current collector bar, and a corresponding grid of metallic lines conductively coupled with the current collector bar; wherein:
    each planar solar cell includes a first edge, a second edge, a third edge, and a fourth edge, a distance between the second edge and the fourth edge defining a characteristic width of each cell;
    each current collector bar comprises at least two conductively coupled collector bar segments, the at least two conductively coupled collector bar segments including a first collector bar segment that is substantially parallel to and proximate to the first edge, and a second collector bar segment that is substantially parallel to and proximate to the second edge, the second edge being orthogonal with respect to the first edge;
    the bypass diode is disposed between the first planar solar cell and the second planar solar cell, proximate to a beveled corner edge of the first planar solar cell;
    a first terminal of the bypass diode is connected by way of a first electrical coupling to the conductive surface of the first solar cell, a proximal portion of the first electrical coupling being connected with the first terminal, a distal portion of the first electrical coupling underlying the rear facing side of the first solar cell;
    a second terminal of the bypass diode is connected by way of a second electrical coupling to the second collector bar segment of the current collector bar of the second solar cell', a proximal portion of the second electrical coupling being connected with the second terminal, a distal portion of the second electrical coupling overlying the front facing side of the second solar cell; and each of the first electrical coupling and the second electrical coupling excludes any external wiring or external busbar.

10. The solar panel of claim 9, wherein in each solar cell assembly:
the first electrical coupling and the second electrical coupling include no portions external to the characteristic width.

11. The solar panel of claim 10, wherein in each solar cell assembly the first electrical coupling includes an interconnect member.

12. The solar panel of claim 10, wherein in each solar cell no collector bar segment is parallel to and proximate to at least one of the third edge and the fourth edge.

13. The solar panel of claim 12, wherein in each solar cell assembly, the second terminal of the bypass diode is adjacent to a proximal end of the second collector bar segment of the second solar cell, and the second electrical coupling includes a first cell interconnect.

14. The solar panel of claim 12, wherein in each solar cell the corresponding grid of metallic lines comprises a plurality of parallel metallic lines, said lines being substantially straight.

15. The solar panel of claim 14, wherein each of the plurality of parallel metallic lines is disposed substantially orthogonal to the first edge and substantially parallel to the second edge.

16. The solar panel of claim 14, wherein each of the plurality of parallel metallic lines is disposed at an acute angle to the first edge and to the second edge.

17. The photovoltaic solar cell assembly of claim 5, wherein the bypass diode is configured to protect both of the first solar cell and the second solar cell, and the bypass diode is electrically coupled with the first solar cell and the second solar cell only by way of the first electrical coupling and the second electrical coupling.

18. The photovoltaic solar cell assembly of claim 17, wherein:
the first collector bar segment of the first solar cell is electrically connected to the conductive surface of the second solar cell with a second cell interconnect; and
the first solar cell and the second solar cell are connected in series to form a series connected pair of solar cells, and the bypass diode is connected in parallel across the series-connected pair of solar cells.

19. The solar panel of claim 13, wherein, within each solar cell assembly, the bypass diode is configured to protect both of the first planar solar cell and the second planar solar cell and the bypass diode is electrically coupled with the first solar cell and the second solar cell only by way of the first electrical coupling and the second electrical coupling.

20. The solar panel of claim 19, wherein, within each solar cell assembly,
the first collector bar segment of the first solar cell is electrically connected to the conductive surface of the second solar cell with a second cell interconnect; and
the first planar solar cell and the second planar solar cell are connected in series to form a series connected pair of solar cells, and the bypass diode is connected in parallel across the series-connected pair of solar cells.

* * * * *